(12) United States Patent
Distefano

(10) Patent No.: US 6,309,915 B1
(45) Date of Patent: Oct. 30, 2001

(54) SEMICONDUCTOR CHIP PACKAGE WITH EXPANDER RING AND METHOD OF MAKING SAME

(75) Inventor: Thomas H. Distefano, Monte Sereno, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/245,224

(22) Filed: Feb. 5, 1999

Related U.S. Application Data

(60) Provisional application No. 60/073,843, filed on Feb. 5, 1998, and provisional application No. 60/084,377, filed on May 6, 1998.

(51) Int. Cl.[7] ............................ H01L 21/44; H01L 21/48; H01L 21/50
(52) U.S. Cl. ..................... 438/127; 438/107; 438/118; 438/126
(58) Field of Search ................................. 438/127, 126, 438/119, 118, 108, 107

(56) References Cited

U.S. PATENT DOCUMENTS

| | | |
|---|---|---|
| 5,148,265 | 9/1992 | Khandros et al. ............... 357/80 |
| 5,148,266 | 9/1992 | Khandros et al. ............... 357/80 |
| 5,258,330 * | 11/1993 | Khandros et al. . |
| 5,455,390 | 10/1995 | DiStefano et al. ............. 174/262 |
| 5,477,611 | 12/1995 | Sweis et al. .................... 29/840 |
| 5,518,964 | 5/1996 | DiStefano et al. ............. 437/209 |
| 5,659,952 | 8/1997 | Kovac et al. .................. 29/840 |
| 5,679,977 | 10/1997 | Khandros et al. ............. 257/692 |
| 5,688,716 * | 11/1997 | DiStefano et al. . |
| 6,127,724 | 10/2000 | DiStefano ...................... 257/675 |
| 6,169,328 * | 1/2001 | Mitchell et al. . |

* cited by examiner

Primary Examiner—Kevin M. Picardat
Assistant Examiner—D. M. Collins
(74) Attorney, Agent, or Firm—Lerner, David, Littenberg, Krumholz & Mentlik, LLP

(57) ABSTRACT

A method of making a semiconductor chip assembly, including providing a dielectric element with a plurality of electrically conductive terminals, disposing an expander ring over the dielectric element so that a semiconductor chip on the dielectric layer is disposed in a central opening in the expander ring, and disposing an encapsulant in the gap between the expander ring and the semiconductor chip. The size of the gap is controlled to minimize the pressure exerted on the leads by the elastomer as it expands and contracts in response to changes in temperature. The semiconductor chip and expander ring may also be connected to a heat sink or thermal spreader with a compliant adhesive.

14 Claims, 14 Drawing Sheets

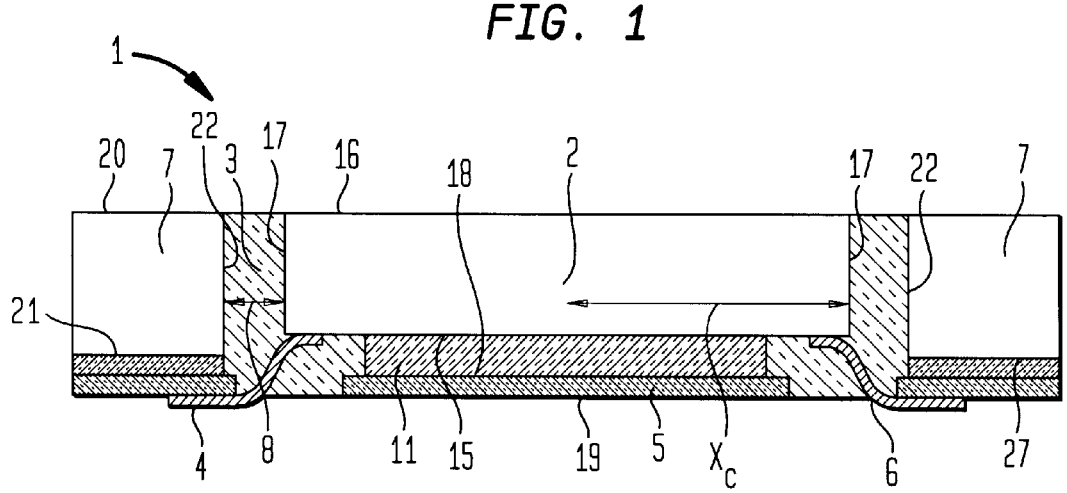
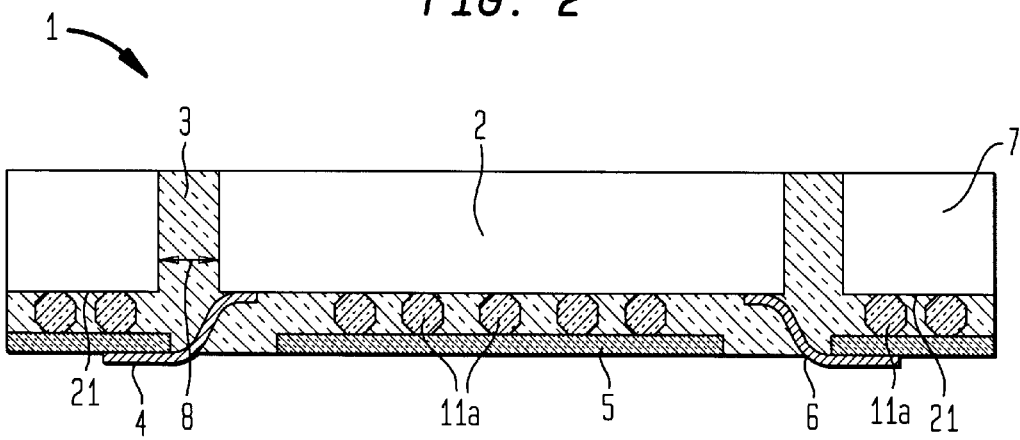

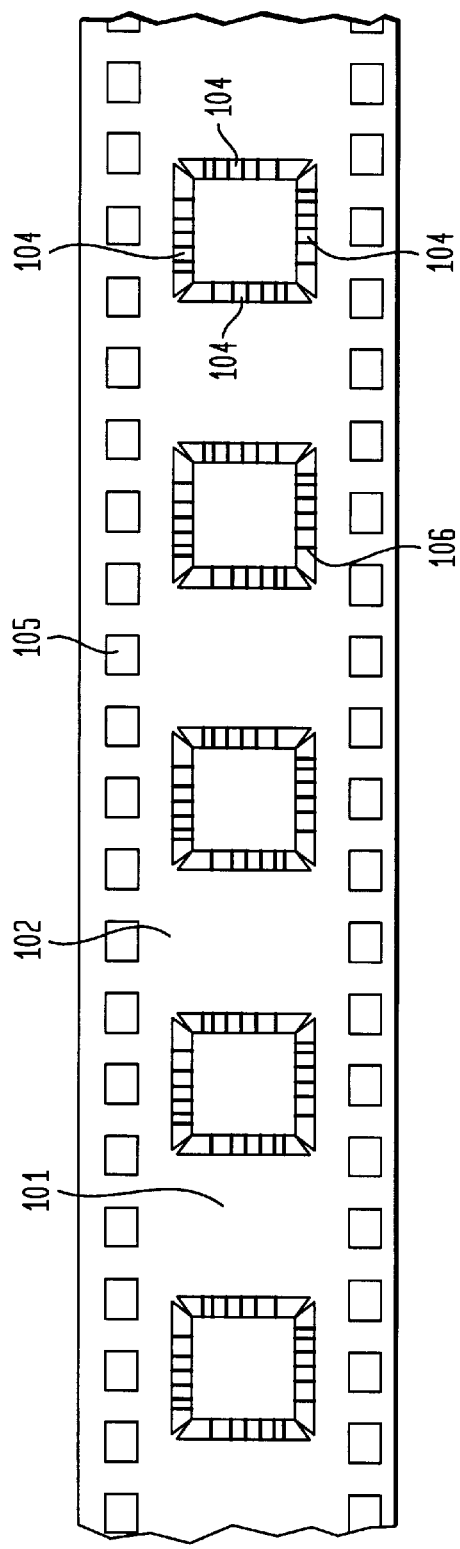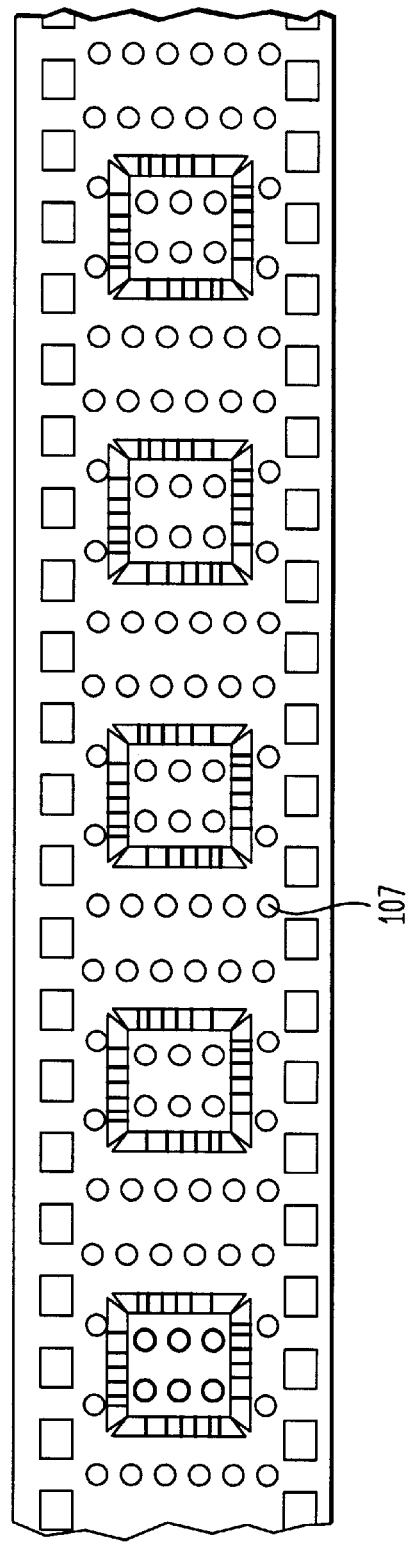

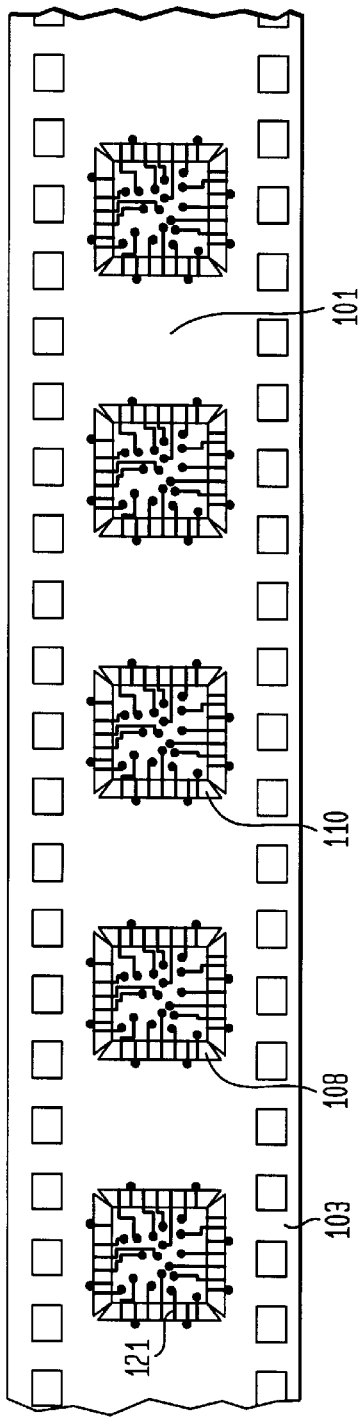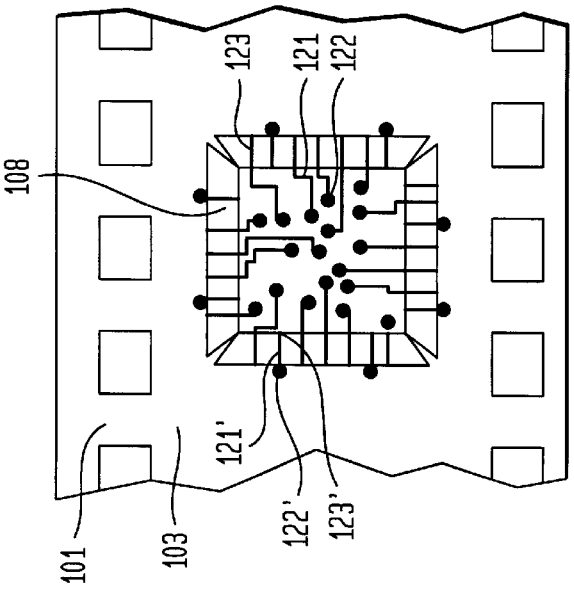

SEMICONDUCTOR CHIP PACKAGE WITH EXPANDER RING AND METHOD OF MAKING SAME

CROSS REFERENCE TO RELATED APPLICATIONS

This application claims benefit of U.S. provisional patent application with Ser. No. 60/073,843, filed Feb. 5, 1998; and U.S. provisional patent application with Ser. No. 60/084,377, filed on May 6, 1998 and entitled "Compliant Semiconductor Chip Package with Fan-out Leads and Method of Making Same", the disclosures of which are incorporated by reference herein.

BACKGROUND OF THE INVENTION

1. Field of the Invention

The present invention relates to the art of electronic packaging, and more specifically to assemblies incorporating microelectronic components and methods of making such assemblies.

2. Description of the Related Art

In attempting to use the area on printed wiring boards more efficiently, semiconductor chip manufacturers have switched some of their production from larger more cumbersome interconnection conventions, such as pin grid arrays and perimeter leaded quad flat packs, to smaller conventions such as ball grid arrays ("BGA") and chip scale packages ("CSP").

Using BGA technology, semiconductor chips are typically interconnected to an external substrate, such as a printed circuit board, using solder connections, such as with "flip-chip" technology. However when solder alone is used to interconnect the chip contact to the external substrate, the columns of solder are generally designed to be short to maintain the solder's structural integrity. This results in minimal elastic solder connections properties which further results in increased susceptibility to solder cracking due to mechanical stress caused by the differential coefficient of thermal expansion ("CTE") of the chip relative to the external substrate thereby reducing the reliability of the solder connection. In other words, when the chip heats up during use, both the chip and the external substrate expand; and when the heat is removed, both the chip and the external substrate contract. The problem that arises is that the chip and the external substrate expand and contract at different rates and at different times, thereby stressing the interconnections between them. As the features of the semiconductor chips continue to be reduced in size, the number of chips packed into a given area will be greater and the heat dissipated by each of these chips will have a greater effect on the thermal mismatch problem. This further increases the need for a highly compliant scheme for interconnecting each chip to the external substrate.

Such an interconnection scheme must also be capable of accommodating a large number of interconnection between a single semiconductor chip and an external substrate, such as a printed circuit board. Complex microelectronic devices such as modem semiconductor chips require numerous connections to other electronic components. For example, a complex microprocessor chip may require many hundreds of connections to an external substrate.

Semiconductor chips commonly have been connected to electrical traces on mounting substrates by one of three methods: wire bonding, tape automated bonding and flip-chip bonding. In wire bonding, the semiconductor chip is positioned on a substrate with one surface of the chip abutting the substrate and the face or contact bearing surface of the chip facing upward, away from the substrate. Individual gold or aluminum wires are connected between the contacts on the semiconductor chip and the current conducting pads on the substrate. In tape automated bonding, a flexible dielectric tape with a prefabricated array of leads thereon is positioned over the semiconductor chip and substrate, and the individual leads are bonded to the contacts and pads. In both wire bonding and conventional tape automated bonding, the current conducting pads on the substrate are arranged outside the area covered by the semiconductor chip, so that the wires or leads "fan-out" from the chip to the surrounding current conducting pads. The area covered by the subassembly is considerably larger than the area covered by chip. Because the speed with which a semiconductor chip package can operate is inversely related to its size, this presents a serious drawback. Moreover, the wire bonding and tape automated bonding approaches are generally most workable with semiconductor chips having contacts disposed in rows extending along the periphery of the chip. They generally do not lend themselves to the use of chips having contacts disposed in a so-called area array, i.e., a grid-like pattern covering all or a substantial portion of the chip face surface.

In the flip-chip mounting technique, the contact-bearing surface of the semiconductor chip faces towards the substrate. Each contact on the semiconductor chip is joined by a solder bond to the corresponding current carrying pad on the substrate, as by positioning solder balls on the substrate or contacts on the semiconductor chip, juxtaposing the chip with the substrate in the face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the contacts on the semiconductor chip and the current carrying pads on the substrate are substantially rigid. Changes in the size of the chip and the substrate due to thermal expansion and contraction in service create substantial stresses in these rigid bonds, which in turn can lead to fatigue failure of the bonds. Moreover, it is difficult to test the semiconductor chip before attaching it to the substrate and hence difficult to maintain the required outgoing quality level in the finished assembly, particularly where the assembly includes numerous semiconductor chips.

Numerous attempts have been made to solve the foregoing problems. Useful CSP solutions are disclosed in commonly assigned U.S. Pat. Nos. 5,148,265; 5,148,266; 5,455,390; 5,477,611; 5,518,964; 5,688,716; and 5,659,952, the disclosures of which are incorporated herein by reference.

In preferred embodiments, the structures disclosed in U.S. Pat. Nos. 5,148,265 and 5,148,266, incorporate flexible, sheet-like structures referred to as "interposers" or "chip carriers". The preferred chip carrier has a plurality of terminals disposed on a flexible, sheet-like top layer. In use, the interposer is disposed on the contact-bearing surface of the chip with the terminals facing upwardly, away from the chip. The terminals are then connected to the contacts on the chip. Most preferably, this connection is made by bonding prefabricated leads on the interposer to contacts on the chip, using a tool engaged with the leads. The completed assembly is then connected to a substrate, as by bonding the terminals of the chip carrier to the substrate. Because the leads and the dielectric layer of the chip carrier are flexible, the terminals on the chip carrier can move relative to the contacts on the chip without imposing significant stresses on the bonds between the leads and the contacts on the chip or on the bonds between the terminals of the chip carrier and the substrate. Thus, the assembly can compensate for thermal effects. Moreover, the assembly most preferably includes a compliant layer disposed between the terminals on the chip carrier and the face of the semiconductor chip itself as, for example, an elastomeric layer incorporated in the chip carrier and disposed between the dielectric layer of the chip carrier and the semiconductor chip. Such a compliant structure permits displacement of the individual terminals independently towards the chip and also facilitates movement of the terminals relative to the chip in directions parallel to the chip surface. The compliant structure further enhances the resistance of the assembly to thermal stresses during use and facilitates engagement between the subassembly and a test fixture during manufacturing. Thus, a test fixture incorporating numerous electrical contacts can be engaged with all of the terminals in the subassembly despite minor variations in the height of the terminals. The substrate can be tested before it is bonded to a substrate so as to provide a tested, known-good part to the substrate assembly operation. This in turn provides very substantial economic and quality advantages.

U.S. Pat. No. 5,455,930 describes a further improvement. Components according to preferred embodiments of the '930 patent use a flexible, dielectric top sheet. A plurality of terminals are mounted on the top sheet. A support layer is disposed underneath the top sheet, the support layer having a bottom surface remote from the top sheet. A plurality of electrically conductive, elongated leads are connected to the terminals on the tip sheet and extend generally side by side downwardly from the terminals through the support layer. Each lead has lower end at the bottom surface of the support layer. The lower ends of the leads have conductive bonding materials as, for example, eutectic bonding metals. The support layer surrounds and supports the leads. Components of this type can be connected to microelectronic elements, such as semiconductor chips or wafers by juxtaposing the bottom surface of the support layer with the contact-bearing surface of the chip so as to bring the lower ends of the leads into engagement with the contacts on the chip, and then subjecting the assembly to elevated temperature and pressure conditions. All of the lower ends of the leads bond to the contacts on the semiconductor chip substantially simultaneously. The bonded leads connect the terminals on the top sheet with the contacts on the chip. The support layer desirable is either formed from a relatively low-modulus, compliant material, or else is removed and replaced after the lead bonding step with such a compliant material. In the finished assembly, the terminals on the relatively flexible dielectric top sheet desirably are moveable with respect to the contacts on the semiconductor chip to permit testing of and to compensate for thermal effects. The component and the methods of the '930 patent provide further advantages, including the ability to make all of the bonds to the chip or other component in a single lamination-like process step.

U.S. Pat. No. 5,518,964 discloses still further improvements. Preferred methods according to the '964 patent, include the step of providing a dielectric connection component having a plurality of terminals and a plurality of leads. Each lead has terminal-end attached to one of the terminals and a tip end (or contact-end) attached to a contact on a chip. Preferred methods also include the step of simultaneously forming all of the leads by moving all of the tip ends of the leads relative to the terminal-ends thereof and relative to the dielectric connection component so as to bend the tip ends away from the dielectric connection component. The dielectric connection component and the chip desirably move in vertical and horizontal directions relative to each other so as to deform the leads towards positions in which the leads extend generally vertically downward, away from the dielectric connection component. The method may also include the step of injecting a flowable compliant dielectric material around the leads. The terminals can be connected to an external substrate, such as a printed circuit board, to thereby provide electrical current communication to the contacts on the chip. Each terminal structure is movable with respect to the contacts on the chip in horizontal directions parallel to the chip, as well as in vertical directions towards and away from the chip, to accommodate differences in thermal expansion and contraction between the chip and the external substrate and to facilitate testing and assembly. The finished assembly can be mounted within an area of an external substrate substantially the same as that required to mount a bare chip.

U.S. Pat. No. 5,477,611 discloses a method of creating an interface between a chip and chip carrier including spacing the chip a give distance above the chip carrier and introducing a liquid in the gap between the chip and the carrier. Preferably, the liquid is an elastomer that is cured into a resilient layer after its introduction into the gap. In another preferred embodiment, the terminals on a chip carrier are planarized or otherwise vertically positioned by deforming the terminals into set vertical locations with a plate, and a liquid is then cured between the chip carrier and the chip.

U.S. Pat. No. 5,688,716 discloses a method of making a semiconductor chip assembly having fan-out leads. The method includes the step of providing a semiconductor chip and a package element attached to the chip. The peripheral region of the package element projects beyond the outer edge of the chip. A dielectric element having terminals on its top surface is positioned over the chip and package element such that a central region of the dielectric element overlies the chip and a peripheral region of the dielectric having at least some of the terminals thereon overlies the peripheral region of the package element. The assembly also has leads that are attached to contacts on the chip and to the terminals on the dielectric element. The method also comprises the step of moving the dielectric element and chip relative to one another such that the leads are bent into a flexible configuration. The method also comprises the step of injecting a liquid beneath the dielectric element and curing such liquid to form a compliant layer.

U.S. Pat. No. 5,659,952 discloses a method of fabricating a compliant interface for a semiconductor chip. The method includes the steps of providing a first support structure, such as a flexible dielectric sheet, having a porous resilient layer thereon. The resilient layer may be a plurality of compliant pads or compliant spacers. A second support element, such as a semiconductor chip, is abutted against the resilient layer and a curable liquid is disposed within the porous resilient layer. The curable liquid may then be cured to form a compliant layer.

Despite the positive results of the aforementioned commonly owned inventions, still further improvements would be desirable.

SUMMARY OF THE INVENTION

The present invention relates to compliant semiconductor chip packages and to methods of making such packages. The semiconductor chip package according to one embodiment of the present invention comprises a dielectric element with a plurality of electrically conductive terminals, an expander ring connected to the dielectric element, a semiconductor chip disposed within a central opening in the expander ring, and fan-in and fan-out leads connecting the terminals to contacts on the semiconductor chip. Semiconductor chip packages having fan-in leads are disclosed in commonly assigned U.S. Pat. No. 5,258,330, the disclosure of which is incorporated herein by reference. Semiconductor chip packages having fan-out leads and semiconductor chip packages having both fan-in and fan-out leads are disclosed in commonly assigned U.S. Pat. No. 5,679,977, the disclosure of which is incorporated herein by reference. The package also comprises an encapsulant disposed in the gap between the expander ring and the semiconductor chip. The size of the gap is controlled to minimize the pressure exerted on the leads by the encapsulant as it expands and contracts in response to changes in temperature. The semiconductor chip and expander ring may also be connected to a heat sink or thermal spreader with a compliant adhesive.

The present invention also relates to a method of making a semiconductor chip package. The method comprises the steps of providing a dielectric element, disposing a compliant layer over the dielectric element, disposing a semiconductor chip over the compliant layer, disposing an expander ring over the compliant layer such that a gap is formed between the inner diameter of a central opening in the expander ring and the outer periphery of the semiconductor chip, and electrically interconnecting terminals on the dielectric element to contacts on the semiconductor chip. If the package is to include a thermal spreader, such thermal spreader can be attached to the semiconductor chip and/or the expander ring with an adhesive. If the coefficient of thermal expansion (hereinafter "CTE") of the thermal spreader and the CTE of the semiconductor chip are not matched, then the adhesive should be a compliant adhesive. In preferred embodiments, the thermal spreader is attached before the contacts and the terminals are electrically interconnected. In preferred embodiments, the semiconductor chip package is encapsulated by injecting a liquid composition, which is curable to an elastomeric encapsulant, into the open spaces between the dielectric element, the semiconductor chip, the expander ring and the optional thermal spreader, including the gap between the outer periphery of the semiconductor chip and the inner diameter of the central opening of the expander ring. The compliant adhesive, the compliant layer and the encapsulant may be comprised of the same or different materials. Prior to injecting the liquid composition, it is desirable to seal the package by adhering a coverlay to the bottom surface of the dielectric element. The coverlay preferably has a plurality of holes which are dispose over and aligned with the terminals on the dielectric element. If a thermal spreader is used and the thermal spreader has relief slots, it is also desirable to adhere a protective film over the thermal spreader to seal such slots. A plurality of solder balls may be attached to the terminals. The semiconductor chip package can be connected to an external circuit via such solder balls.

BRIEF DESCRIPTION OF THE DRAWINGS

FIG. 1 is a side view of one embodiment of the semiconductor chip assembly of the present invention.

FIG. 2 is a side view of another embodiment of the semiconductor chip assembly of the present invention.

FIGS. 8A–8S show views of a plurality of semiconductor chip packages in progressive steps in a manufacturing process according to one embodiment of the method of the present invention. FIGS. 8A, 8B, 8C, 8E are top plan view of such packages in various steps in such manufacturing process. FIG. 8H is a bottom plan view of the packages in progress after the manufacturing step described in FIG. 8G has been completed. FIG. 8I is an exploded view of a portion of FIG. 8H. FIGS. 8P–8S are bottom plan view of such packages in various steps in such manufacturing process.

DETAILED DESCRIPTION OF THE PREFERRED EMBODIMENTS

Figure 3:
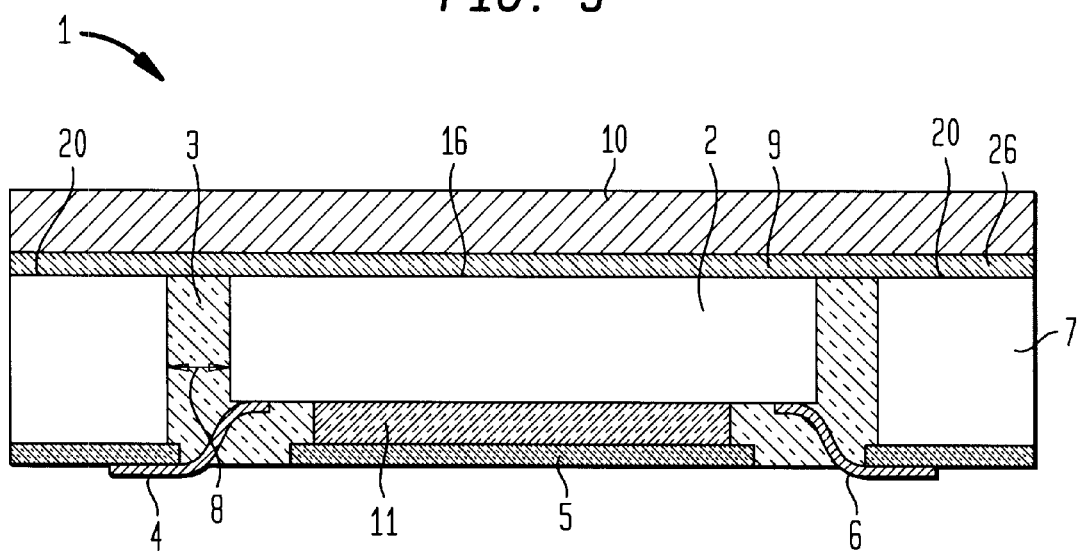
FIG. 3 is a side view of another embodiment of the semiconductor chip assembly of the present invention.

As depicted in FIG. 1, the semiconductor chip assembly 1 according to one aspect of the present invention includes a semiconductor chip 2, an expander ring 7 and a dielectric element 5. Semiconductor chip 2 has a face surface 15, a back surface 16 opposite the face surface, and four side surfaces 17 (two of which are visible in FIG. 1) which connect the face surface to the back surface. The four side surfaces form the outer perimeter of semiconductor chip 2. Expander ring 7 has a first surface 20, a second surface 21 opposite the first surface, and four inner side walls 22 (two of which are visible in FIG. 1) which define a central opening. Dielectric element 5 has a top surface 18, a bottom surface 19 opposite top surface 18, and a plurality of apertures 6. Top surface 18 is comprised of a central region, which is disposed beneath the face surface 15 of semiconductor chip 2, and a peripheral region that surrounds the central region. Descriptors such as "top", "bottom", "beneath", etc, should be understood to refer to the drawing in FIG. 1 and not to any gravitational frame of reference. In preferred embodiments dielectric element 5 is flexible. Expander ring 7 is disposed over dielectric element 5 such that second surface 21 confronts the peripheral region of the top surface 18 of dielectric element 5. The CTE of the dielectric element is preferably from 15 to 22 ppm/° C., inclusive. The CTE of the expander ring is preferably from 5 to 30 ppm/° C., inclusive. Semiconductor chip 2 is disposed within the central opening of expander ring 7 such that a gap 8 is formed between the outer perimeter of semiconductor chip 2 and the four inner side walls 22 of the central opening of expander ring 7. A compliant layer 11 is disposed between face surface 15 of semiconductor chip 2 and top surface 18 of dielectric element 5. The CTE of the compliant layer is preferably from 100 to 300 ppm/° C., inclusive. An adhesive 27 is disposed between the expander ring 7 and the dielectric element 5. An encapsulant 3 is disposed within gap 8. In preferred embodiments, $$W \geq (CTE_{expander\ ring} - CTE_{chip})X_c)/(CTE_{encapsulant}(1+2p));$$

where w is the width of gap 8; $CTE_{expander\ ring}$ is the coefficient of thermal expansion of the expander ring; $CTE_{chip}$ is the coefficient of thermal expansion of the semiconductor chip; $X_c$ is the shortest distance between the outer edge of the chip and the center of the chip (See FIG. 1); $CTE_{encapsulant}$ is the coefficient of thermal expansion of the encapsulant; and p is the Poisson ratio for the encapsulant. In preferred embodiments, the encapsulant is elastomeric, has a modulus of 0.5 to 600 MPa. and is comprised of a silicone gel, a silicone elastomer, a filled silicone elastomer, a urethane, an epoxy, or a flexiblized epoxy. In particularly preferred embodiments, the elastomeric encapsulant is comprised of a silicone elastomer.

A plurality of leads 4 interconnect contacts on the semiconductor chip 2 to terminals on the dielectric element 5. Leads 4 may be formed by any method, including the methods disclosed in commonly assigned U.S. Pat. Nos. 5,390,844; 5,398,863; 5,489,749; 5,491,302; and 5,536,909, the disclosures of which are incorporated herein by reference. Leads 4 may also be formed by wire bonding. In preferred embodiments, the leads are comprised of gold, copper or alloys thereof or combinations thereof.

The leads 4 are used to electrically interconnect terminals on the dielectric element to contacts on the semiconductor chip or to electrically interconnect the terminals to an external circuit. The apertures 6 may be used to provide access for a bonding tool to the leads so that such electrically interconnections can be made. The apertures are optional and may be replaced with other means for making such electrical interconnections. One such means is an electrically conductive path disposed within such dielectric element.

In another embodiment of the present invention, and as depicted in FIG. 2, compliant layer 11 may include a plurality of compliant spacers 11a. One or more such compliant spacers 11a may also be disposed between second surface 21 of expander ring 7 and the peripheral region of top surface 18 of dielectric element 5. Compliant spacers 11a preferably have a modulus of 0.5 to 600 MPa. In preferred embodiments, the compliant spacers 11a are comprised of a silicone gel, a silicone elastomer or a flexiblized epoxy. In particularly preferred embodiments, the compliant spacers are comprised of a silicone elastomer.

In order to dissipate heat from the assembly, a thermal spreader 10 may be connected to back surface 16 of semiconductor chip 2 with a first adhesive 9, as depicted in FIG. 3. Thermal spreader 10 may also be connected to the first surface 20 of expander ring 7 with a second adhesive or ring adhesive 26. The second adhesive may also be used to accommodate for differences and tolerances between the semiconductor chip and the expander ring. First adhesive 9 and second adhesive 26 may be comprised of the same or different materials. In preferred embodiments, the first and second adhesives have a modulus between 0.5 to 600 MPa. The first and second adhesives are preferably comprised of a silicone gel, a silicone elastomer, a polyimide siloxane, or a flexiblized epoxy. The first and second adhesives may further comprise one or more fillers. In preferred embodiments, at least one of such fillers has a high thermal conductivity. Such highly thermally conductive fillers may be metallic or non-metallic. In preferred embodiments the second adhesive is comprised of a silicone elastomer. For semiconductor chip packages that will be used in low power applications, the preferred first adhesive is selected from the group consisting of filled flexiblized epoxies and filled silicone elastomers. Filled flexiblized epoxies are particularly preferred. For semiconductor chip packages which will be used in medium power applications, the preferred first adhesive is selected from the group consisting of filled flexiblized epoxies, filled polyimide siloxanes and filled silicone elastomers. For semiconductor chip packages which will be used in high power applications, the preferred first adhesive is an epoxy filled with silver/glass, an epoxy filled with gold/geranium alloys, or an epoxy filled with gold/silicon alloys.

Figure 4:
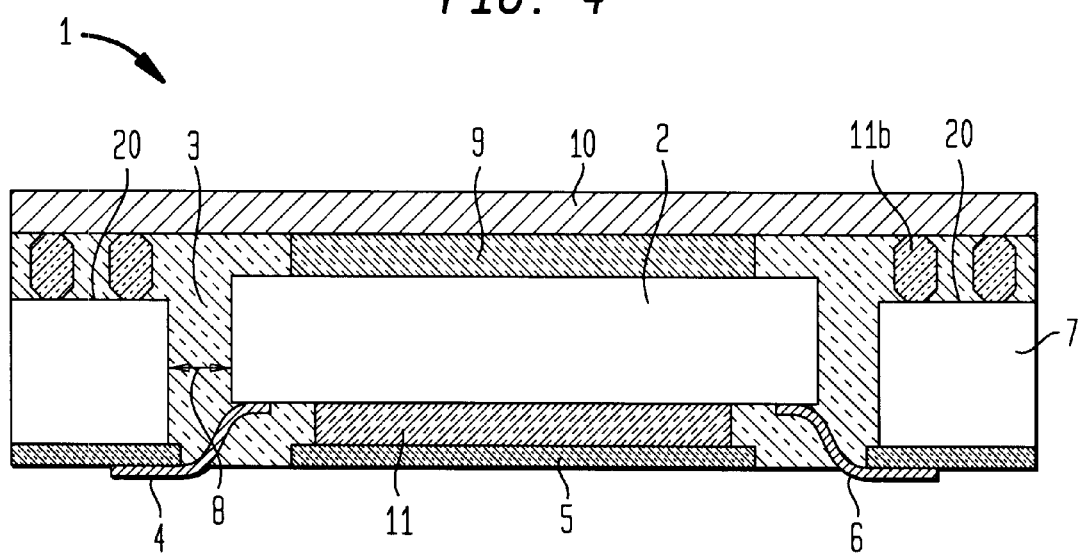
FIG. 4 is a side view of another embodiment of the semiconductor chip assembly of the present invention.

In an alternative embodiment, and as depicted in FIG. 4, a plurality of compliant spacers 11b may be disposed between thermal spreader 10 and the first surface 20 of expander ring 7. In preferred embodiments, the compliant spacers 11b are comprised of a silicone gel, a silicone elastomer or a flexiblized epoxy. In particularly preferred embodiments, the compliant spacers are comprised of a silicone elastomer.

Figure 5:
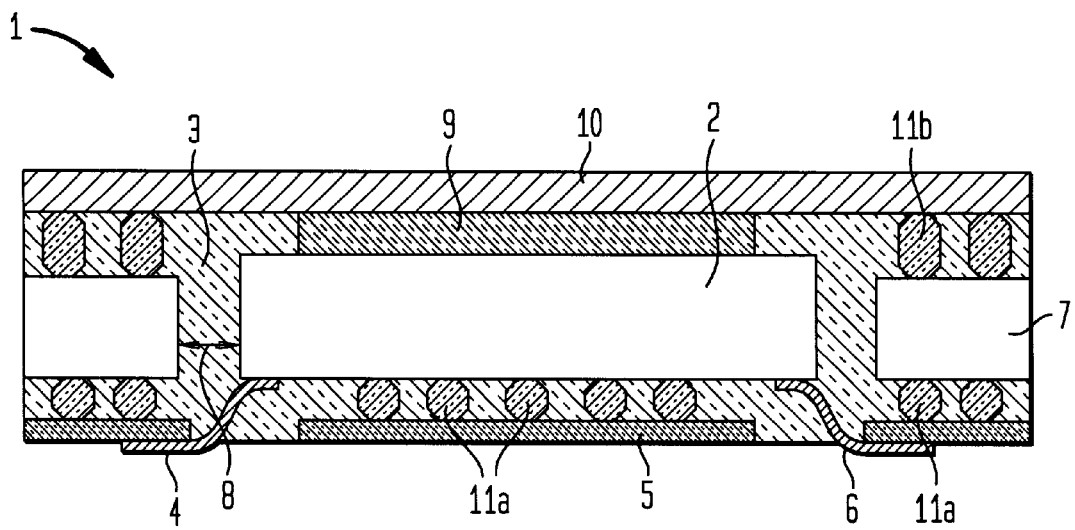
FIG. 5 is a side view of another embodiment of the semiconductor chip assembly of the present invention.

In preferred embodiments and as depicted in FIG. 5, semiconductor chip 2 is connected to dielectric element 5 with a compliant layer comprised of compliant spacers 11a. Expander ring 7 is connected to the peripheral region of the top surface 18 of dielectric element 5 with a plurality of compliant spacers 11a and to thermal spreader 10 with a plurality of compliant spacers 11b. Compliant spacers 11a and 11b may have similar dimensions or, as depicted in FIG. 5, different dimensions. Compliant spacers 11a and 11b may be comprised of the same or different materials.

Figure 6:
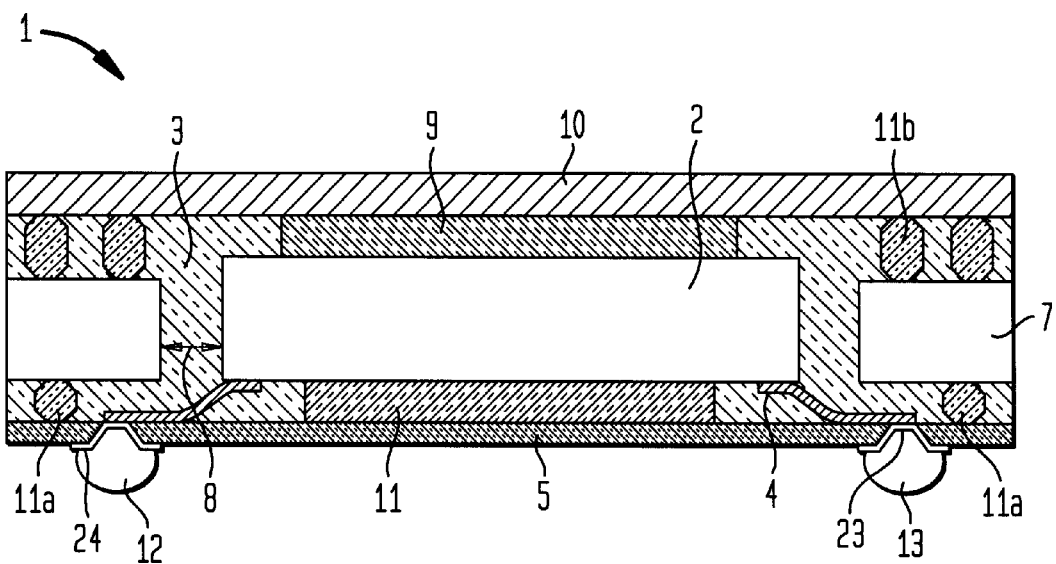
FIG. 6 is a side view of another embodiment of the semiconductor chip assembly of the present invention.

As depicted in FIG. 6, terminals 23 on the dielectric element 5 may be disposed on the top surface 18 of the dielectric element 5. Leads 4 connect contacts (not shown) on semiconductor chip 2 with terminals 23. A plated via 24 disposed in dielectric element 5 is connected to each terminal 23. An electrically conductive mass 13 is disposed within each via 24. In preferred embodiments each electrically conductive mass 13 is a solder ball.

Figure 7:
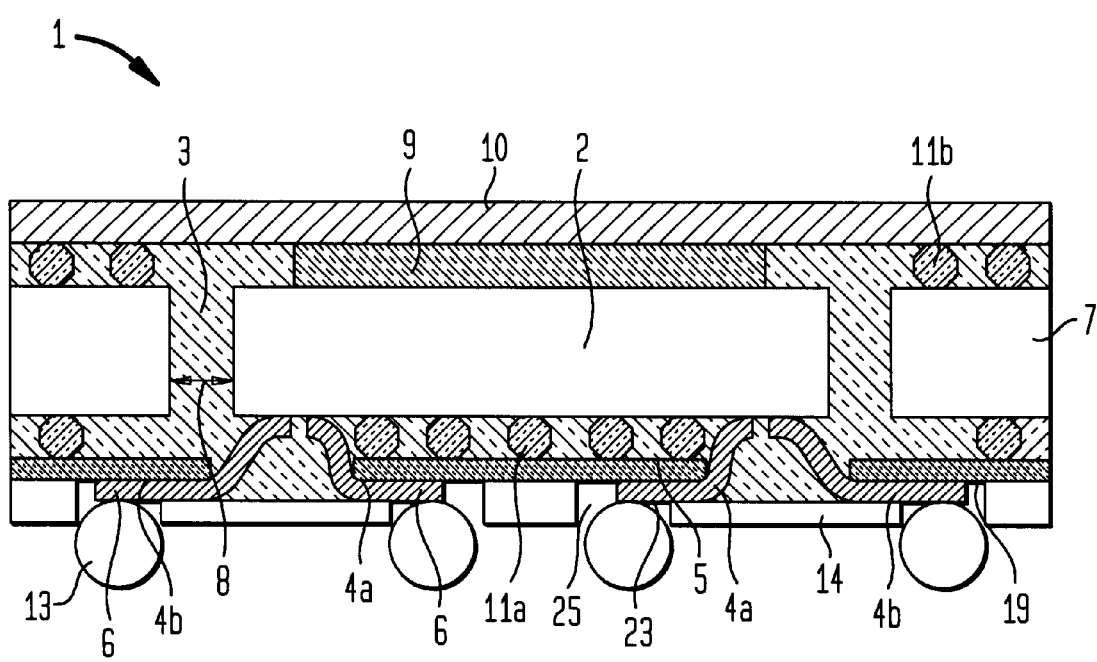
FIG. 7 is a side view of another embodiment of the semiconductor chip assembly of the present invention.

As depicted in FIG. 7, the semiconductor chip assembly 1 of the present invention may have both fan-in leads 4a and fan-out leads 4b. Dielectric element 5 has apertures 6 which accommodate both fan-in leads 4a and fan-out leads 4b. In preferred embodiments the fan-in and fan-out leads are arranged interstitially such that every other lead in a row of leads is a fan-in lead and the remaining leads are fan-out leads. Assembly 1 also has a solder mask or coverlay 14. Coverlay 14 is disposed over the bottom surface 19 of dielectric element 5. Coverlay 14 has a plurality of holes 25 which are aligned with terminals 23. Assembly 1 further comprises a plurality of electrically conductive masses 13 which are disposed in such holes 25. Masses 13 can be used to electrically and physically connect the assembly to an external circuit, such as a printed circuit board.

The dielectric element described with reference to the above semiconductor chip packages and methods for making the same preferably is a flexible dielectric element. In particularly preferred embodiments, the dielectric element is a thin sheet of a polymeric material such as a polyimide, a fluoropolymer, a thermoplastic polymer, or an elastomer, with polyimide being a particularly preferred material for use as the flexible dielectric element. In preferred embodiments, the flexible dielectric element is from 10 to 100 microns and more preferably from 25 to 75 microns thick.

Each expander ring is used to support the solder balls which are attached to the terminals of the fan-out leads and to add structural stability to the package. The strip of expander rings may be made of any material which will support the solder balls. The expander rings may be made a conductive or a non-conductive material. The expander rings may be made of a metal, a plastic, or a paper based material. In preferred embodiments, the expander rings are comprised of a material selected from alloy 42, copper, invar, steel, polypropylene, epoxy or paper phenolic, or alloys thereof, or combinations thereof. In particularly preferred embodiments, the expander rings are comprised of a material selected from copper, copper alloys, steel and combinations thereof. The expander ring may be thicker or thinner than the associated semiconductor chip. In preferred embodiments however, the thickness of the expander ring is less than or equal to the thickness of the semiconductor die. The CTE of the expander ring is preferably intermediate between the CTE of the semiconductor chip and the CTE of the dielectric element. If the package contains a thermal spreader, the CTE of the thermal spreader is preferably low, close to the CTE of the semiconductor chip, and the CTE of the expander ring is preferably intermediate between the CTE of the thermal spreader and the CTE of the dielectric element. In preferred embodiments, the CTE of the thermal spreader is from 5 to 30 ppm/° C., inclusive. One or more capacitors, transistors, and/or resistors may be embedded in the expander ring and/or on the dielectric element and electrically connected, via wire bonds, solder or a conductive adhesive, to one or more terminals on the dielectric element.

The thermal spreader is made from a material having a high thermal conductivity. In preferred embodiments, the CTE of the thermal spreader is close to the CTE of the semiconductor chip. For semiconductor chip packages which will be used in low power applications, the thermal spreader is preferably made from a material selected from the group consisting of copper, copper alloys, nickel plated copper alloys, aluminum, aluminum alloys, anodized aluminum alloys, and steel. For semiconductor chip packages which will be used in medium power applications, the thermal spreader is preferably made from a material selected from the group consisting of copper, copper alloys, alloy 42 and multi-layered laminates containing copper coated invar. The preferred multi-layer laminate is copper-invar-copper. For semiconductor chip packages which will be used in high power applications, the thermal spreader is preferably made of a material selected from the group consisting of aluminum nitride and tungsten copper.

The coverlay may be a temporary coverlay or a permanent coverlay. The coverlay material must be capable of being bonded, at least temporarily, to the dielectric element and of sealing any apertures or holes in such element. The coverlay is preferably ½ mil to 10 mils thick, more preferably ½ mil to 5 mils thick, most preferably less than 2.5 mils thick. The coverlay material is preferably comprised of polypropylene, polyester, polyimide or combinations thereof, with polyimide being particularly preferred for use as a permanent coverlay and polypropylene being particularly preferred for applications using a temporary coverlay. Materials which are commonly used as solder masks, such as solder masks sold under Dupont's brand name Pyralux® may also be used as a coverlay. Dupont's Pyralux® solder mask are generally photoimageable, dry film solder masks which are based on acrylic, urethane and -imide based materials. The coverlay may also comprise an adhesive layer. The adhesive layer is preferably comprised of an acrylic, epoxy or silicone adhesive, with acrylic adhesives being particularly preferred. Prior to the step in which the coverlay is laminated to the dielectric element, the adhesive layer must be tacky or must be in a form that is heat and/or pressure activated. In preferred embodiments, the coverlay used in the present invention is a permanent coverlay. The coverlay may have a plurality of apertures. If the coverlay is comprised of a photoimageable material, the apertures may be formed in the coverlay after it is attached to the dielectric element.

The semiconductor chip package of the present invention can be made according to the method of the present invention. FIGS. 8A–8S depict various steps in one method of the present invention. As depicted in FIG. 8A, a dielectric element 101 is provided. In preferred embodiments, dielectric element 101 is flexible. Dielectric element 101 is in a strip form and has a top surface 102, a bottom surface (not shown) opposite top surface 102, and a plurality of apertures 104. Apertures 104 are sometimes also referred to as bond windows. The flexible dielectric element described with reference to the above semiconductor chip packages and methods for making the same is preferably a thin sheet of a polymeric material such as a polyimide, a fluoropolymer, a thermoplastic polymer, or an elastomer, with polyimide being a particularly preferred material for use as the flexible dielectric element. In preferred embodiments, the flexible dielectric element is from 10 to 100 microns and more preferably from 25 to 75 microns thick. Polyimide in strip form is generally supplied with a plurality of sprocket holes 105. Although such sprocket holes may be used as an alignment aid in the method of the present invention, such sprocket holes are not required to practice the present method.

Flexible dielectric element 101 has a plurality of electrically conductive traces 106. Only a portion of each trace is visible through the bond windows 104. Each trace 106 has a contact end and a terminal-end. The contact-end will eventually be connected to a contact on the face surface of semiconductor chip 108. Neither the tip nor the terminal-ends are visible in FIG. 8A. Traces 106 may be disposed on either the top surface 102 or the bottom surface 103 of the flexible dielectric element 101. In the embodiment pictured in FIGS. 8A–8S, traces 106 are disposed on the bottom surface 103 (See FIG. 8H).

As depicted in FIG. 8B, a plurality of compliant spacers 107 are disposed on the top surface 102 of flexible dielectric element 101. Some methods of disposing such compliant spacers or resilient elements are described in commonly assigned U.S. Pat. No. 5,659,952 and U.S. patent application with Ser. No. 08/879,922 and a filing date of Jun. 20, 1997, the disclosures of which are incorporated herein by reference. In preferred embodiments, the compliant spacers 107 are comprised of a silicone gel, a silicone elastomer or a flexiblized epoxy. The compliant spacers preferably have a modulus of 0.5 to 600 MPa. In particularly preferred embodiments, the compliant spacers are comprised of a silicone elastomer. Prior to die attach some or all of the compliant spacers 107 may be in an uncured, partially cured or fully cured state. An adhesive may be disposed on the top surface of such spacers 107. Commonly assigned U.S. patent application with Ser. No. 08/931,680 and a filing date of Sep. 16, 1997, the disclosure of which is incorporated herein by reference, teaches one method of disposing an adhesive over a compliant spacer or compliant pad.

Figure 8C:
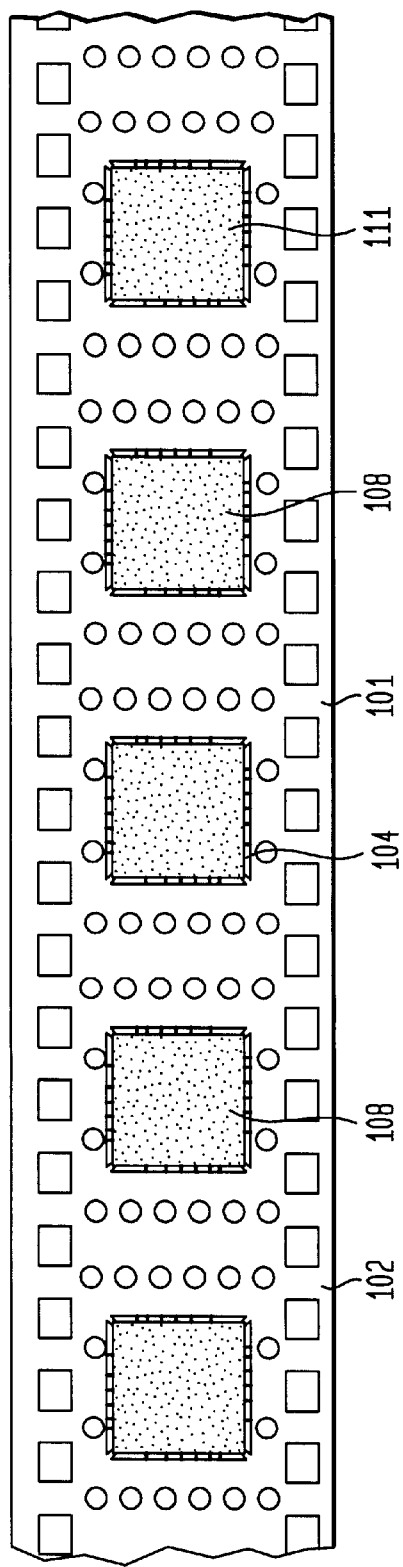

As depicted in FIG. 8C, a plurality of semiconductor chips 108 are then disposed over the top surface 102 of flexible dielectric element 101. Each chip 108 has a face surface (not shown), a back surface 111 opposite the face surface, and a plurality of electrically conductive contacts (not shown) disposed on the face surface 110. Each chip 108 is positioned over one set of bond windows 104 and the face surface of each is adhered to flexible dielectric element 101. If compliant spacers 107 are in an uncured state, a partially cured state, or have an adhesive disposed on the top surfaces of such spacers, chips 108 may be adhered to flexible dielectric element 101 using such spacers 107. Heat and pressure may be required to achieve a good bond between spacers 107 and chips 108.

Figure 8D:
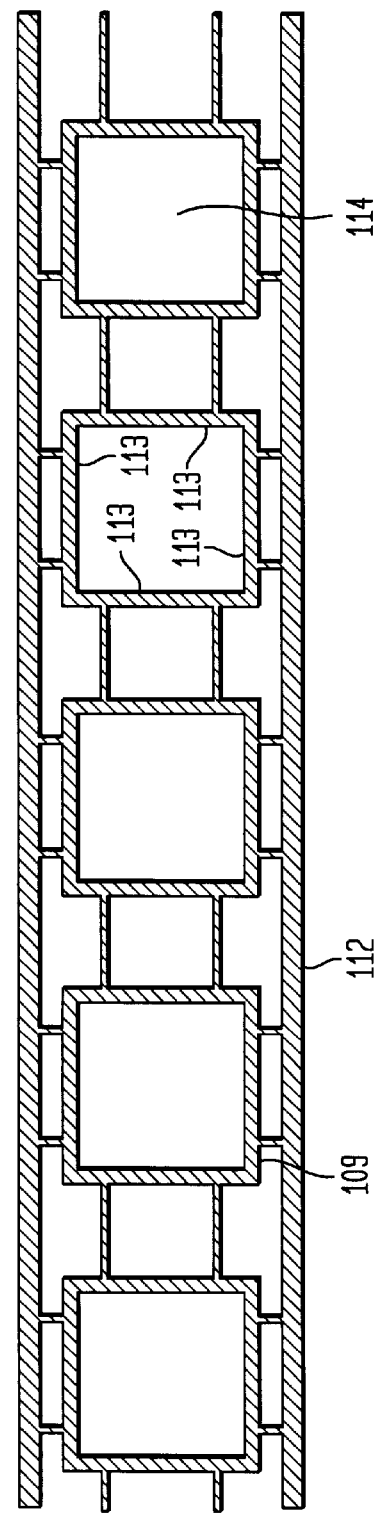
FIG. 8D is a top plan view of a component used in such manufacturing process.

As depicted in FIG. 8D, a strip of expander rings 109 is provided. Each expander ring 109 has a first surface 112, a second surface (not shown) opposite first surface 112, and four inner side walls 113 which define a central opening 114. Each expander ring is used to support the solder balls which are attached to the terminals of the fan-out leads and to add structural stability to the package. Various methods of packaging semiconductor chips using expander rings are described in co-pending, commonly assigned U.S. patent application Ser. No. 09/067,310, having a filing date of Apr. 28, 1998, the disclosure of which is hereby w incorporated herein by reference. The expander rings of the '310 application are referred to as unitary support structures.

The strip of expander rings 109 may be made of any material which will support the solder balls. The expander rings may be made of a conductive or a non-conductive material. The expander rings may be made of a metal, a plastic, or a paper based material. In preferred embodiments, the expander rings are comprised of a material selected from alloy 42, copper, invar, steel, polypropylene, epoxy or paper phenolic, or alloys thereof, or combinations thereof. In particularly preferred embodiments, the expander rings are comprised of a material selected from copper, copper alloys, steel and combinations thereof. The expander ring may be thicker or thinner than the associated semiconductor chip. In preferred embodiments however, the thickness of the expander ring is less than or equal to the thickness of the semiconductor die. The CTE of the expander ring is preferably intermediate between the CTE of the semiconductor chip and the CTE of the flexible dielectric element. If the package contains a thermal spreader, the CTE of the thermal spreader is preferably low, close to the CTE of the semiconductor chip, and the CTE of the expander ring is preferably intermediate between the CTE of the thermal spreader and the CTE of the flexible dielectric element. One or more capacitors, resistors, and/or transistors, may be embedded in the expander ring and electrically connected, via wire bonds, solder or a conductive adhesive, to one or more terminals on the flexible dielectric element.

Figure 8E:
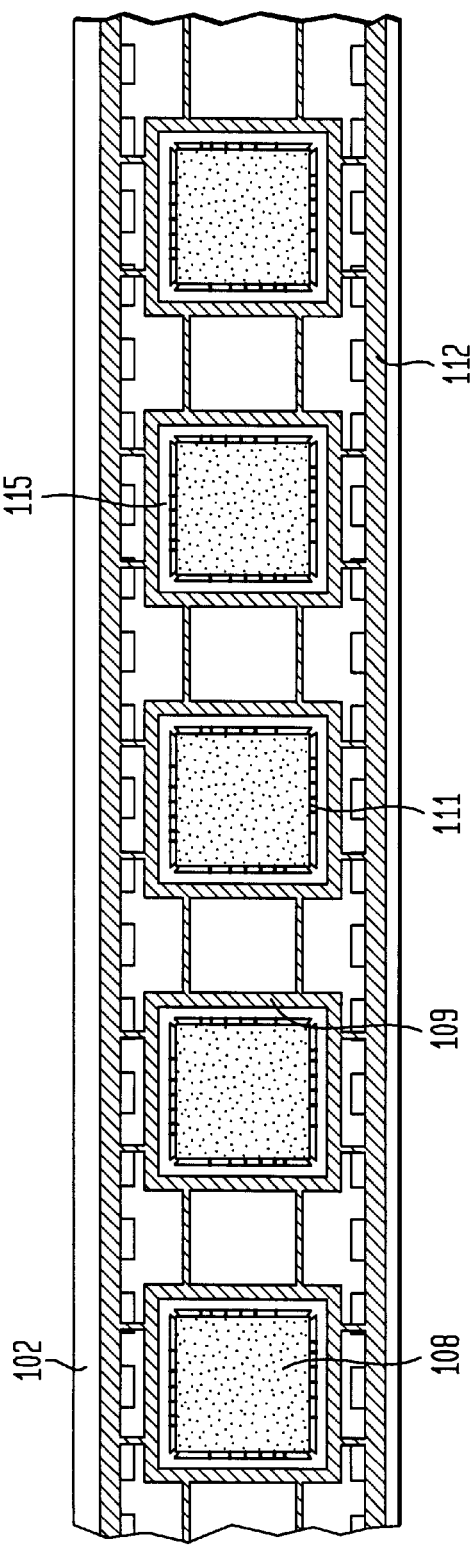

As depicted in FIG. 8E, the strip of expander rings 109 is disposed over the flexible dielectric element 101 such that a) the second surface of each expander ring 109 confronts the top surface 102 of the flexible dielectric element 101; b) the central opening 114 of each expander ring 109 is disposed around one of the semiconductor chips 108; and c) for each semiconductor chip 108, a gap 115 is maintained between each inner side wall 113 and the outer perimeter of the semiconductor chip 108. In preferred embodiments, $$W \geq \{(CTE_{expander\ ring} - CTE_{chip})X_c\}/\{CTE_{encapsulant}(1+2p)\};$$

where w is the width of gap 115; $CTE_{expander\ ring}$ is the coefficient of thermal expansion of the expander ring; $CTE_{chip}$ is the coefficient of thermal expansion of the semiconductor chip; $X_c$ is the shortest distance between the outer edge of the chip and the center of the chip; $CTE_{encapsulant}$ is the coefficient of thermal expansion of the encapsulant; and p is the Poisson ratio for the encapsulant which will be disposed within the gap. With some chips, such as, for example rectangular chips, Xc is not constant for all points on the outer edge of the chip. For such chips, w can be calculated for each point on the outer edge of the chip. The gap between the chip and the expander ring, as measured at each such point on the outer edge of the chip should be at least the value of w calculated for that point. In preferred embodiment however, the width of the gap is constant and is selected to be at least as wide as the highest value of w calculated for the chip.

In preferred embodiments, the encapsulant is elastomeric. In more preferred embodiments, the elastomeric encapsulant has a modulus of 0.5 to 600 MPa. and is comprised oF a silicone gel, a silicone elastomer, a filled silicone elastomer, a urethane, an epoxy, or a flexiblized epoxy. In particularly preferred embodiments, the elastomeric encapsulant is comprised of a silicone elastomer.

The strip of expander rings 109 may have one or more fiducuals to aid in the proper alignment of the expander rings on the flexible dielectric element. The sprocket holes 105 may also be used to aid in the alignment of the expander rings. The second surface of each of the expander rings 109 is adhered to the compliant spacers 107, preferably using heat and/or pressure. In preferred embodiments, the first surface 112 of each expander ring 109 is coplanar with the back surface 111 of each semiconductor chip 108. The second surface of the expander ring may be coplanar with the face surface of each semiconductor chip 108. Such heat and pressure can also be used to correct for any lack of coplanarity between each expander ring 109 and the associated semiconductor chip 108.

Figure 8F:
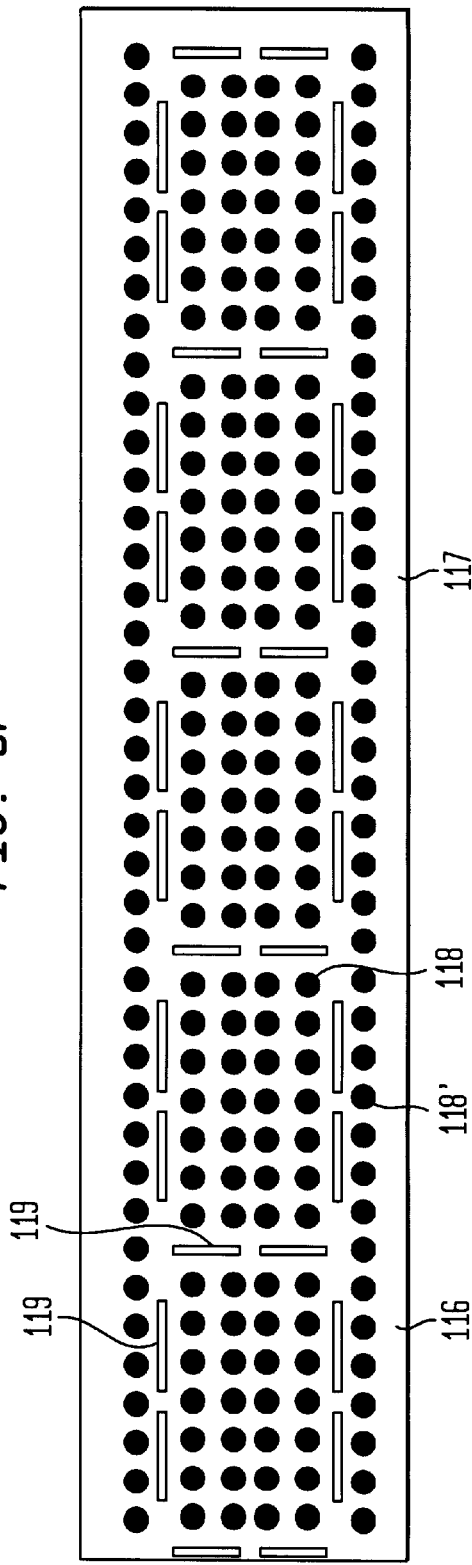
FIG. 8F is a bottom plan view of another component used in such manufacturing process.

As depicted in FIG. 8F, a strip of thermal spreaders 116 is provided. The strip of thermal spreaders 116 has an alpha surface (not shown) and a beta surface 117 opposite the alpha surface. The thermal spreader is made from a material having a high thermal conductivity. In preferred embodiments, the CTE of the thermal spreader is close to the CTE of the semiconductor chip. For semiconductor chip packages which will be used in low power applications, the thermal spreader is preferably made from a material selected from the group consisting of copper, copper alloys, nickel plated copper alloys, aluminum, aluminum alloys, anodized aluminum alloys, and steel. For semiconductor chip packages which will be used in medium power applications, the thermal spreader is preferably made from a material selected from the group consisting of copper, copper alloys, alloy 42 and multi-layered laminates containing copper coated invar. The preferred multi-layer laminate is copper-invar-copper. For semiconductor chip packages which will be used in high power applications, the thermal spreader is preferably made of a material selected from the group consisting of aluminum nitride and tungsten copper.

The strip of thermal spreaders 116 may have a plurality of elongated slots 119. Such slots 119 are incorporated in the strip of thermal spreaders 116 to ease the singulation process in which the strip of packaged semiconductor chips are cut into individual packages. The strip of thermal spreaders 116 may have one or more fiducials to aid in the alignment of the thermal spreaders. The strip of thermal spreaders may be aligned with sprocket holes 105 in flexible dielectric element 101 to aid in the positioning of the thermal spreaders. A first adhesive 118 is disposed on the beta surface 117. Such adhesive may take for example, the form of a pad, a film or a dispensed pattern such as a plurality of dots of adhesive. Adhesive 118 will eventually be used to bond beta surface 117 to the back surfaces of each of semiconductor chips 108. A second adhesive or ring adhesive 118' may also be disposed on beta surface 117 and be in the form of a pad, a film or a plurality of dots. Second adhesive 118 may be used to accommodate for differences and tolerances between the semiconductor chip and the expander ring. The dots of adhesive 118' will eventually be used to bond beta surface 117 to first surface 112 of each expander ring 109. If the CTE of the strip of thermal spreaders 116 and the CTE of the semiconductor chips is not matched, then adhesive 118 should be compliant. In preferred embodiments, both adhesives 118 and 118' are compliant. Adhesives 118 and 118' may be comprised of the same or different materials. In preferred embodiments, the first and second adhesives are comprised of a silicone gel, a silicone elastomer, a polyimide siloxane, or a flexiblized epoxy. The first and second adhesive may further comprises one or more fillers. In preferred embodiments, at least one of such fillers has a high thermal conductivity. Such highly thermally conductive fillers may be metallic or non-metallic. In preferred embodiments, the first and second adhesives have a modulus between 0.5 to 600 MPa. and are comprised of a silicone gel, a silicone elastomer, a polyimide siloxane, or a flexiblized epoxy. In particularly preferred embodiments the second adhesive is comprised of a silicone elastomer. For semiconductor chip packages which will be used in low power applications, the preferred first adhesive is selected from the group consisting of filled flexiblized epoxies and filled silicone elastomers. Filled flexiblized epoxies are particularly preferred. For semiconductor chip packages which will be used in medium power applications, the preferred first adhesive is selected from the group consisting of filled flexiblized epoxies, filled polyimide siloxanes and filled silicone elastomers. For semiconductor chip packages which will be used in high power applications, the preferred first adhesive is an epoxy filled with silver/glass, an epoxy filled with gold/geranium alloys, or an epoxy filled with gold/silicon alloys. The dimensions of the dots of adhesives 118 and 118' may be the same or different.

Figure 8G:
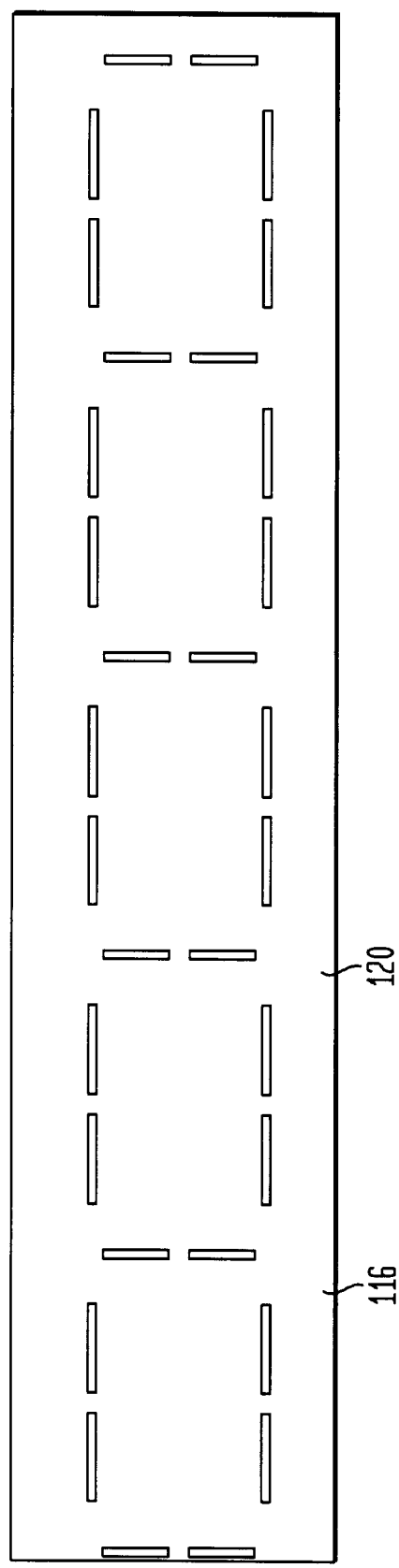
FIG. 8G is a top plan view of such packages after the component of FIG. 8F has been adhered to such packages.

The strip of thermal spreaders 116 is disposed over semiconductor chips 108 and expander rings 109 such that the beta surface 117 of the strip of thermal spreaders 116 confronts the back surfaces 111 of semiconductor chips 108 and the first surfaces 112 of each expander ring 109. The strip of thermal spreaders 116 is adhered to such back surfaces and first surfaces with the adhesives 118 and 118'. Once this is complete, the alpha surface 120 of the strip of expander rings 109 is visible from a top plan view, as depicted in FIG. 8G.

FIG. 8H is a view of the bottom surface 103 of the flexible dielectric element 101 prior to the processing step in which the leads are formed. A portion of the face surface 110 of each chip 108 is visible in FIG. 8H through bond windows 104. FIG. 8H also depicts a plurality of electrically conductive traces 121 disposed on the bottom surface 103 of flexible dielectric element 101. FIG. 8I is an exploded view of a portion of FIG. 8H, depicting more details of traces 121. Each trace 121 has a terminal 122 and a contact-end 123. Some of the traces 121 have a terminal 122 that is disposed on a portion of flexible dielectric element 101 which lies underneath the face surface 110 of semiconductor chip 108. The directional descriptor "underneath", as used to describe FIG. 8H (which is a bottom plan view), should be read to mean "below when viewed from a top plan view" and not with reference to any gravitational frame of reference. Some traces will eventually be formed into "fan-in" leads. Some of the traces (such as trace 121') have a terminal 122' that is disposed on a portion of the flexible dielectric element which lies underneath the second surface of expander ring 109. Such traces 121' will eventually be formed into "fan-out" leads. The package depicted in FIG. 8I has a total of 26 traces. In preferred embodiments, the package will have 40 or more leads, more preferably 40 to 1000 leads. In preferred embodiments, terminals 122 and 122' are disposed in ordered rows or an area array having a consistent pitch. In preferred embodiments, the fan-in and fan-out leads are comprised of gold, copper or alloys thereof or combinations thereof.

Figure 8J:
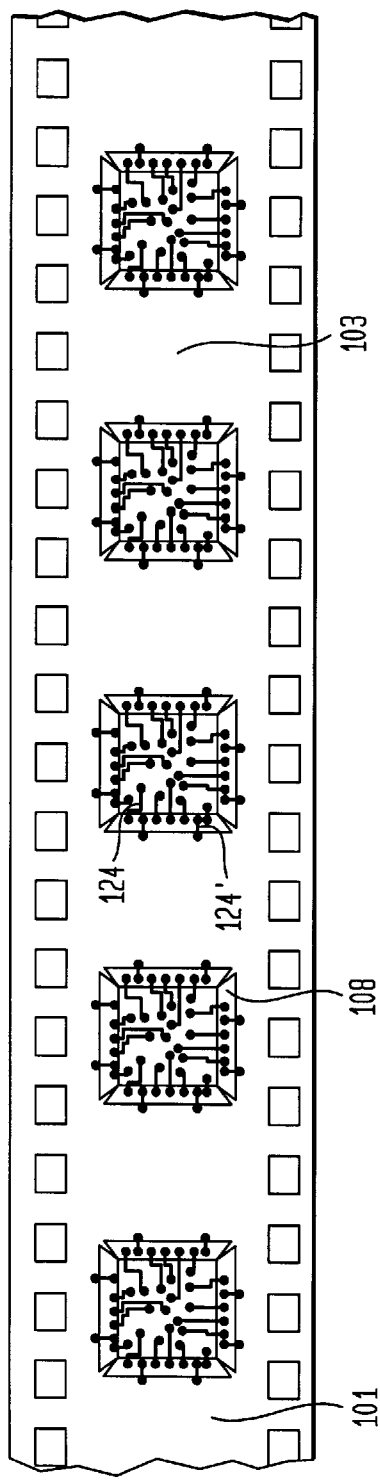
FIG. 8J is a bottom plan view of the packages in progress after another manufacturing process step has been completed.
Figure 8K:
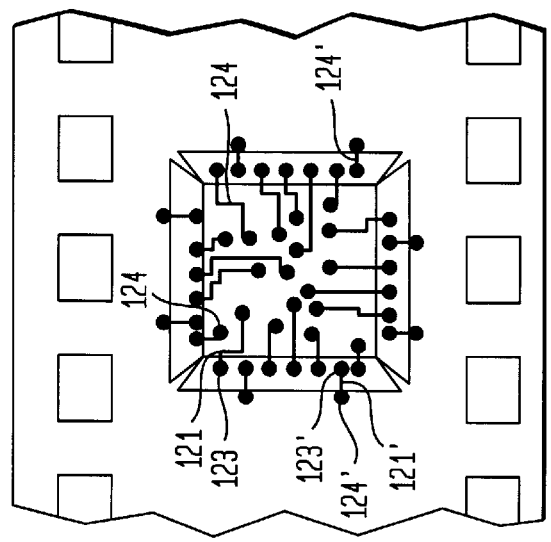
FIG. 8K is an exploded view of a portion of FIG. 8J.

FIG. 8J depicts the flexible dielectric element 101 and the plurality of chips 108 after the fan-in and fan-out leads have been formed. FIG. 8K is an exploded view of a portion of FIG. 8J. As depicted in FIG. 8K, the contact-end 123 of each trace 121 is bonded to an electrically conductive contact on the face surface 110 of semiconductor chip 108 to form a fan-in lead 124 which electrically interconnects the chip 108 to the flexible dielectric element 101. The contact-end 123' of each trace 121' is bonded to an electrically conductive contact on the face surface 110 of semiconductor chip 108 to form a fan-out lead 124'. The fan-in and fan-out leads may be formed by any method, including the methods disclosed in commonly assigned U.S. Pat. Nos. 5,390,844; 5,398,863; 5,489,749; 5,491,302; and 5,536,909, the disclosures of which are incorporated herein by reference. In an alternative embodiment, the fan-in and fan-out leads may be formed by wire bonding each contact to the respective terminal.

Figure 8L:
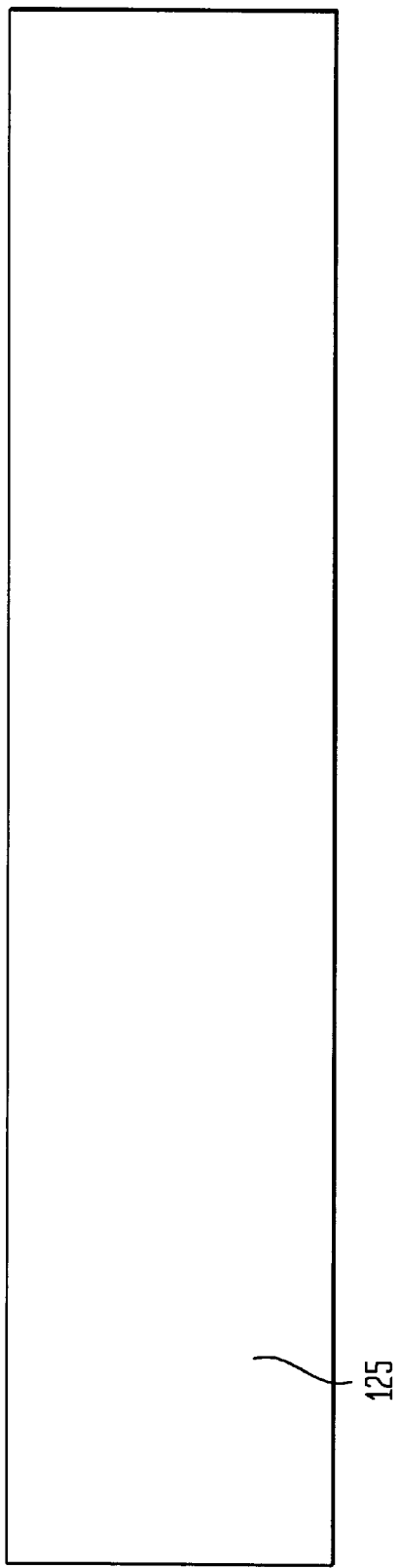
FIG. 8L is a bottom plan view of another component used in such manufacturing process.

Next, the bond windows 104 and any other apertures or holes in flexible dielectric element 101 are sealed using a coverlay, such as coverlay 125 which is depicted in FIG. 8L.

The coverlay may be a temporary coverlay or a permanent coverlay. The coverlay material must be capable of being bonded, at least temporarily, to the flexible dielectric element and of sealing any apertures or holes in such element. The coverlay is preferably ½ mil to 10 mils thick, more preferably ½ mil to 5 mils thick, most preferably less than 2.5 mils thick. The coverlay material is preferably comprised of polypropylene, polyester, polyimide or combinations thereof, with polyimide being particularly preferred for use as a permanent coverlay and polypropylene being particularly preferred for applications using a temporary coverlay. Materials which are commonly used as solder masks, such as solder masks sold under Dupont's brand name Pyralux® may also be used as a coverlay. Dupont's Pyralux® solder masks are generally photoimageable, dry film solder mask which are based on acrylic, urethane and -imide based materials. The coverlay may also comprise an adhesive layer. The adhesive layer is preferably comprised of an acrylic, epoxy or silicone adhesive, with acrylic adhesives being particularly preferred. Prior to the step in which the coverlay is laminated to the flexible dielectric element, the adhesive layer must be tacky or must be in an activatable form, such as a heat and/or pressure activated from. In preferred embodiments, the coverlay used in the present invention is a permanent coverlay. The coverlay may have a plurality of apertures. If the coverlay is comprised of a photoimageable material, the apertures may be formed in the coverlay after it is attached to the flexible dielectric element.

Figure 8M:
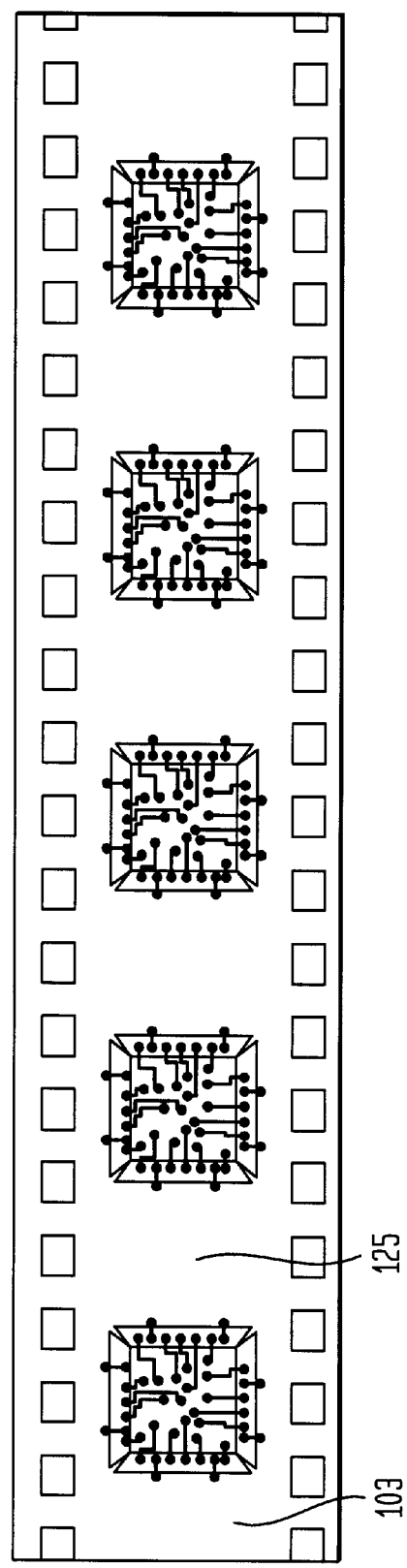
FIG. 8M is a bottom plan view of the packages in process after the component of FIG. 8L has been adhered to such packages.

The coverlay depicted in FIG. 8L is photoimageable and has been exposed in a pattern corresponding to the pattern of terminals on the flexible dielectric element. As depicted in FIG. 8M, coverlay 125 is laminated to the bottom surface 103 of flexible dielectric element 101. The coverlay may be vacuum laminated, pressure laminated, vacuum-pressure laminated or otherwise laminated onto the bottom surface 103 of the flexible dielectric element 101. FIG. 8M depicts the bottom surface 103 after a transparent coverlay 125 has been laminated to it.

Figure 8N:
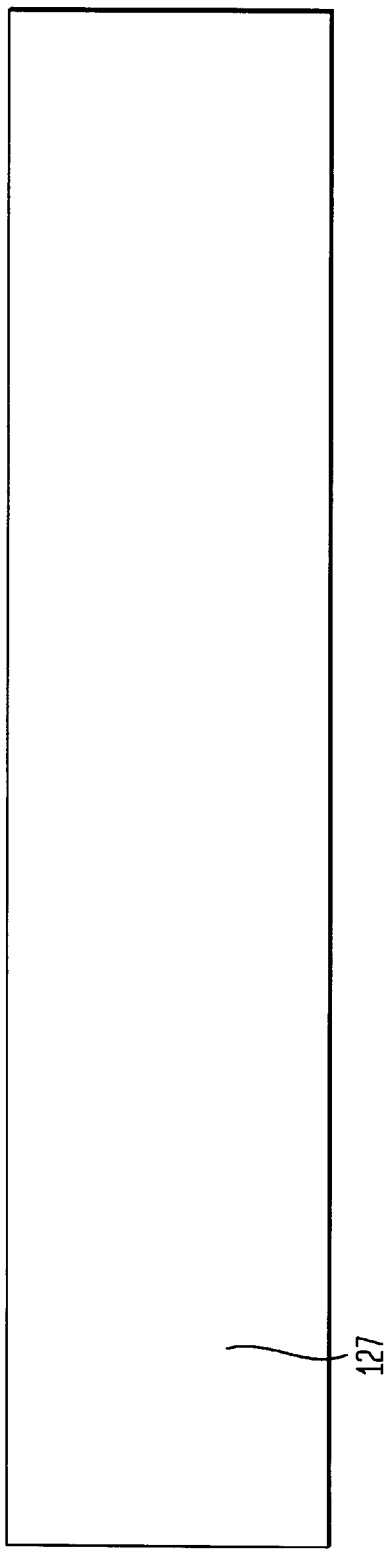
FIG. 8N is a top plan view of another component used in such manufacturing process.
Figure 8O:
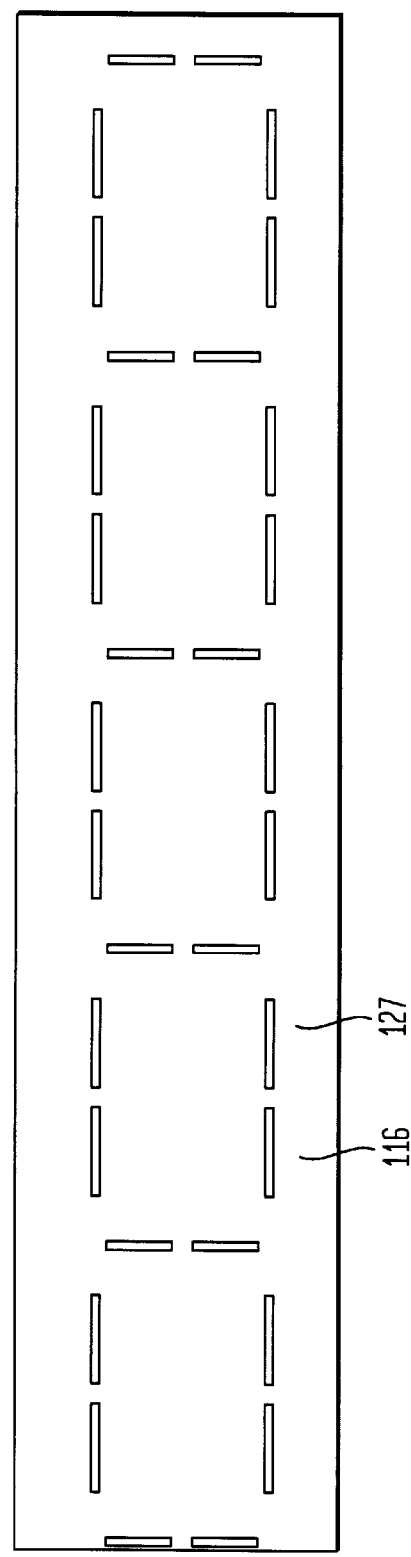
FIG. 8O is a top plan view of the packages in process after the component of FIG. 8N has been adhered to such packages.

A protective film 127 is provided, as depicted in FIG. 8N. The protective film of the present invention can be any of the materials listed above for the coverlay. In preferred embodiments, however, the protective film used in the present invention is a temporary coverlay which is removed after use. The protective film may be removed by, for example, using heat, peeling the film from the strip of thermal spreaders, or immersing the protective film in a caustic solution. Protective film 127 is used to seal the elongated slots and any other apertures in thermal spreader 116 while a liquid composition is injected into the assembly to encapsulated it. Protective film 127 should be capable of being bonded to the alpha surface of thermal spreader 116. Since protective film 127 may be removed after the encapsulation process, in preferred embodiments, protective film 127 forms only a temporary bond to the alpha surface of the strip of thermal spreaders 116. As depicted in FIG. 8O, film 127 is adhered to the thermal spreader 116 to seal the elongated slots 119.

After coverlay 125 has been laminated to flexible dielectric element 101 and after protective film 127 has been adhered to the alpha surface of the strip of thermal spreaders 116, the assembly can be encapsulated using a liquid composition which is curable to an encapsulant In preferred embodiments the encapsulant is elastomeric. The elastomeric encapsulant increases the reliability of the assembly by compensating for the mismatch in CTE between the semiconductor chip package and an external circuit. The liquid composition is disposed between the top surface 102 of the flexible dielectric element 101 and the thermal spreader 116. The liquid composition fills the open spaces between any of the expander ring, the thermal spreader, the semiconductor chip, the flexible dielectric element, the compliant adhesive, and the compliant spacers. The liquid composition also fills in gap 115 (see FIG. 8E) between the expander ring 109 and the semiconductor chip 108. The assembly may be encapsulated with the liquid composition via a dispensing operation, a dispensing operation followed by subjecting the assembly to vacuum and or pressure, a dispensing operation preformed while the assembly is under vacuum, or by a pressurized injection operation. Various methods of encapsulating the assembly are disclosed, for example, in commonly assigned U.S. patent application Ser. No. 09/067,698 filed on Apr. 28, 1998.

Figure 8P:
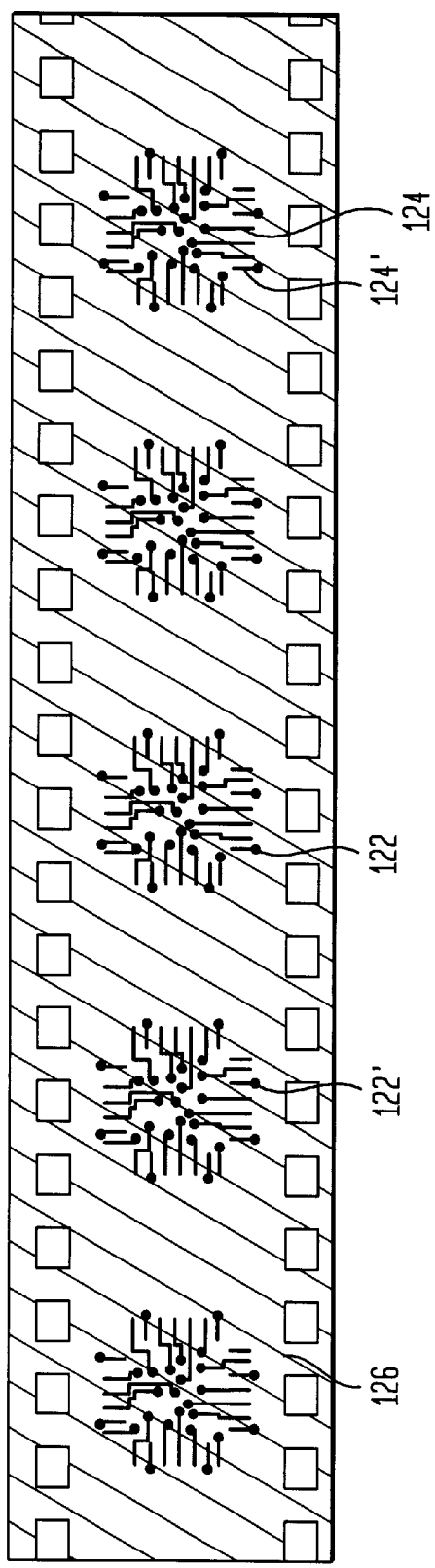
Figure 8Q:
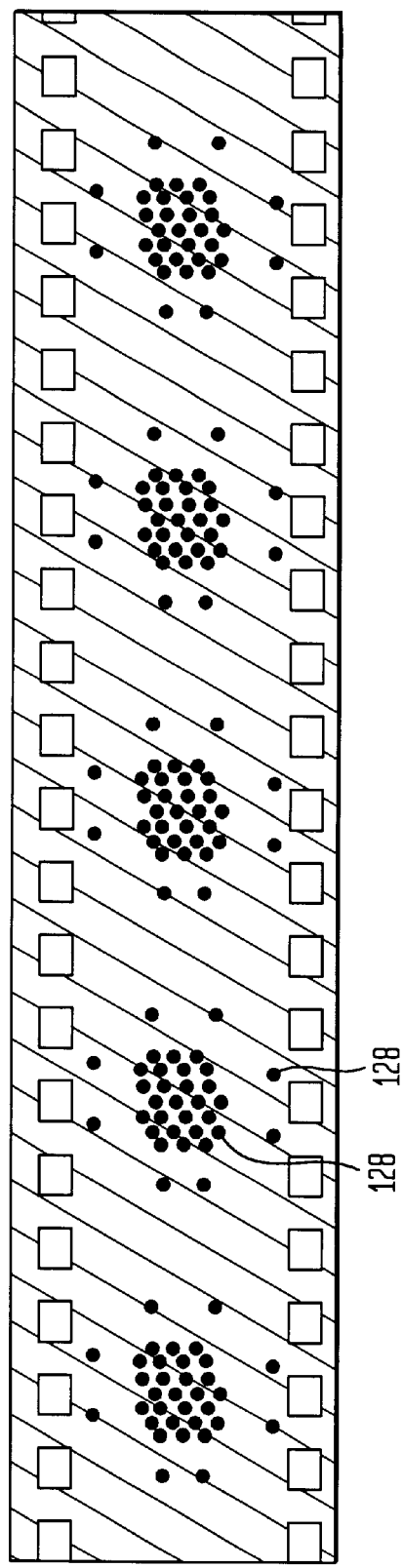
Figure 8R:
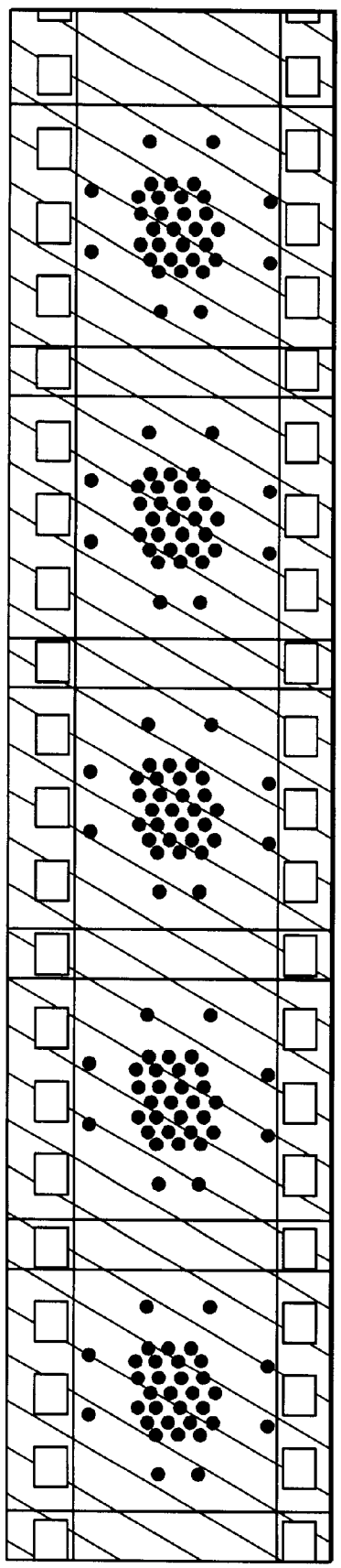
Figure 8S:
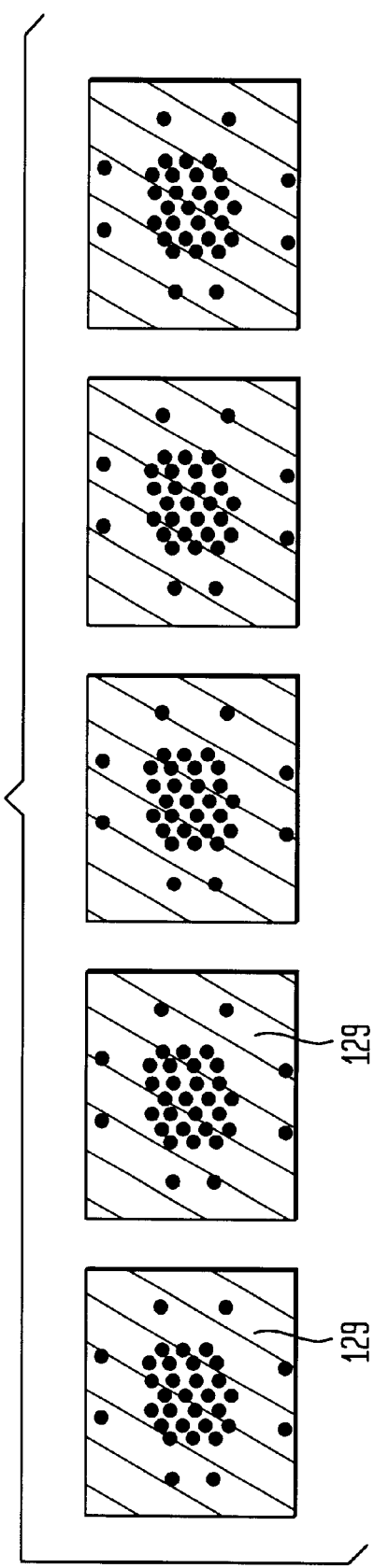

FIG. 8P depicts the assembly of the present invention after the strip has been vacuum impregnated with liquid composition 126. Terminals 122 and 122' and a portion of each lead 124 and 124' are visible in FIG. 8P. The coverlay 125 seals against the bottom surface 103 of the flexible dielectric element 101 to prevent the liquid encapsulant 126 from contaminating terminals 122 and 122'. After being impregnated into the assembly, liquid composition 126 is cured or at least partially cured. Protective film 127 may then removed from thermal spreader 116. Holes are formed in coverlay 125 by exposing the photimageable coverlay to a developer, such as potassium carbonate. The holes are formed in a pattern corresponding to the pattern of terminals 122 and 122' on flexible dielectric element 101. Flux is then applied on the terminals and, as depicted in FIG. 8Q, solder balls 128 are disposed within the holes in coverlay 125. The solder balls are reflowed. The plurality of semiconductor chips 108 are then singulated as depicted in FIG. 8R and FIG. 8S to form a plurality of packaged semiconductor chip assemblies 129.

The method described with reference to FIGS. 8A–8S employs various process steps which are conducted on components in strip format. The method of the present invention may also be practiced with components that are supplied in a reel to reel format.

That which is claimed is:

1. A method of making a plurality of semiconductor chip assemblies, said method comprising the steps of:

I. providing a dielectric element having a top surface and a plurality of electrically conductive traces, wherein each electrically conductive trace has a terminal-end, a contact-end opposite the terminal-end, and an electrically conductive terminal disposed at the terminal-end;

II. disposing a compliant layer on the top surface of the dielectric element;

III. providing a plurality of semiconductor chips, each of the semiconductor chips having a face surface, a plurality of electrically conductive contacts disposed on the face surface, and a plurality of side surfaces which define the outer perimeter of the semiconductor chip;

IV. adhering the face surface of each semiconductor chip to the compliant layer;

V. providing a strip of expander rings, each of the expanders rings having a plurality of inner side walls which define a central opening;

VI. disposing the strip of expander rings over the top surface of the dielectric element such that
a) each of the semiconductor chips is associated with one of the expander rings;
b) each of the semiconductor chips is disposed within the central opening of the associated expander ring; and
c) a gap is formed between the outer perimeter of each the semiconductor chips and the inner side walls of the associated expander ring;

VII. forming at least one lead connecting each semiconductor chip to the dielectric element by connecting at least one contact on the face surface of each semiconductor chip to the contact-end of one of the traces; and VIII. encapsulating each of the semiconductor chip assemblies by filling the gap and open spaces between the dielectric element, the compliant layer, the semiconductor chip and the expander ring with a liquid composition which is curable to an encapsulant; wherein $w \geq \{(CTE_{expander\ ring} - CTE_{chip})X_c\}/\{CTE_{encapsulant}(1+2p)\};$ where w is the width of each gap; $CTE_{chip}$ is the coefficient of thermal expansion of one of the semiconductor chips; $CTE_{expander\ ring}$ is the coefficient of thermal expansion of the associated expander ring; $X_c$ is the shortest distance between a point on the outer perimeter of the semiconductor chip and the center of the semiconductor chip; $CTE_{encapsulant}$ is the coefficient of thermal expansion of the encapsulant; and p is the Poisson ratio of the encapsulant.

2. The method of claim 1, wherein the encapsulant is elastomeric, the dielectric element is a flexible, the terminals are disposed on the top surface of said flexible dielectric element, and the flexible dielectric element includes a plurality of plated vias, each of the plated vias being in electrical contact with one of the terminals.

3. The method of claim 2, further comprising the step of disposing a solder ball within each of the plated vias.

4. The method of claim 1, wherein the encapsulant is elastomeric; the dielectric element is flexible, has a bottom surface opposite the top surface, and a plurality of apertures; and the terminals are disposed on the bottom surface of the flexible dielectric element.

5. The method of claim 4, further comprising the steps of providing a coverlay; and sealing the apertures in the flexible dielectric element, prior to the encapsulating step, by laminating the coverlay to the bottom surface of the flexible dielectric element.

6. The method of claim 5, wherein the coverlay has a plurality of holes, each of which is aligned with one of the terminals on the flexible dielectric element and wherein said method further comprises the step of disposing a solder ball on each of the plurality of terminals.

7. The method of claim 1, wherein
a) the semiconductor chip has a back surface opposite the face surface; and
b) the method further comprises the steps of
   providing a strip of thermal spreaders, wherein each of the thermal spreaders has a beta surface; and
   adhering the beta surface of each thermal spreader to the back surface of one of the semiconductor chips with a first adhesive; and
c) the encapsulating step further includes the step of filling open spaces between the thermal spreader; and the flexible dielectric element, the compliant layer, the semiconductor chip, and the expander ring, with the liquid composition.

8. The method of claim 7, wherein each of the thermal spreaders has an alpha surface opposite the beta surface and a plurality of relief slots.

9. The method of claim 8, further comprising the steps of providing a protective film; and sealing the relief slots in the strip of thermal spreaders, prior to the encapsulating step, by adhering the protective film to the alpha surface of the thermal spreaders.

10. The method of claim 1 wherein at least some of the plurality of leads are fan-out leads and at least some of the plurality of leads are fan-in leads.

11. The method of claim 1, further comprising the step of at least partially curing the liquid composition.

12. The method of claim 1, further comprising the step of electrically interconnecting the terminals to an external substrate.

13. A method of making a semiconductor chip assembly, said method comprising the steps of:

I. providing a dielectric element having a top surface and a plurality of electrically conductive traces, wherein each electrically conductive trace has a terminal-end, a contact-end opposite the terminal-end, and an electrically conductive terminal disposed at the terminal-end;

II. disposing a compliant layer on the top surface of the dielectric element;

III. providing a semiconductor chip having a face surface, a plurality of electrically conductive contacts disposed on the face surface, and a plurality of side surfaces which define the outer perimeter of the semiconductor chip;

IV. adhering the face surface of the semiconductor chip to the compliant layer;

V. providing an expander ring having a plurality of inner side walls which define a central opening;

VI. disposing the expander ring over the top surface of the dielectric element such that the semiconductor chips is disposed within the central opening of the expander ring and a gap is formed between the outer perimeter of the semiconductor chips and the inner side walls of the expander ring;

VII. forming at least one lead connecting the semiconductor chip to the dielectric element by connecting at least one contact on the face surface of the semiconductor chip to the contact-end of one of the traces; and VIII. encapsulating the semiconductor chip assemblies by filling the gap and open spaces between the dielectric element, the compliant layer, the semiconductor chip and the expander ring with a liquid composition which is curable to an encapsulant; wherein $w \geq \{(CTE_{expander\ ring} - CTE_{chip})X_c\}/\{CTE_{encapsulant}(1+2p)\}$;

where w is the width of the gap; $CTE_{chip}$ is the coefficient of thermal expansion of the semiconductor chips; $CTE_{expander\ ring}$ is the coefficient of thermal expansion of the expander ring; $X_c$ is the shortest distance between a point on the outer perimeter of the semiconductor chip and the center of the semiconductor chip; $CTE_{encapsulant}$ is the coefficient of thermal expansion of the encapsulant; and p is the Poisson ratio of the encapsulant.

14. The method of claim 13 wherein the encapsulant is elastomeric and the dielectric element is flexible.

* * * * *

UNITED STATES PATENT AND TRADEMARK OFFICE
CERTIFICATE OF CORRECTION

PATENT NO. : 6,309,915 B1
DATED : October 30, 2001
INVENTOR(S) : Thomas H. DiStefano It is certified that error appears in the above-identified patent and that said Letters Patent is hereby corrected as shown below:

<u>Title page,</u>
Item [75], "Distefano" should read -- DiStefano --

<u>Column 1,</u>
Line 57, "interconnection" should read -- interconnections --

<u>Column 4,</u>
Line 22, "give" should read -- given --

<u>Column 5,</u>
Line 51, "dispose" should read -- disposed --

<u>Column 6,</u>
Line 11, "view" should read -- views --
Line 31, "view" should read -- views --

<u>Column 9,</u>
Line 61, "mask" should read -- masks --

<u>Column 11,</u>
Line 19, "hereby w incorporated" should read -- hereby incorporated --
Line 57, "W$\geqq$" should read -- w$\geqq$ --

<u>Column 12,</u>
Line 5, "In preferred" should read -- In the preferred --

<u>Column 13,</u>
Line 6, "chips is" should read -- chips are --
Line 12, "adhesive" should read -- adhesives --
Line 13, "comprises" should read -- comprise --

<u>Column 14,</u>
Line 42, "mask" should read -- masks --
Line 50, "from" should read -- form --

<u>Column 15,</u>
Line 10, "encapsulated" should read -- encapsulate --
Line 51, "may then" should read -- may then be --

UNITED STATES PATENT AND TRADEMARK OFFICE
CERTIFICATE OF CORRECTION

PATENT NO. : 6,309,915 B1
DATED : October 30, 2001
INVENTOR(S) : Thomas H. DiStefano It is certified that error appears in the above-identified patent and that said Letters Patent is hereby corrected as shown below:

Column 16,
Line 30, "of each" should read -- of each of --
Line 56, "a flexible," should read -- a flexible dielectric element, --

Column 17,
Line 22, "spreader;" should read -- spreader --

Column 18,
Line 17, "chips is" should read -- chips are --

Signed and Sealed this

Eleventh Day of March, 2003

JAMES E. ROGAN
*Director of the United States Patent and Trademark Office*